(12) United States Patent
Hill

(10) Patent No.: US 6,825,727 B1
(45) Date of Patent: Nov. 30, 2004

(54) RADIO FREQUENCY POWER TRANSISTOR AVALANCHE BREAKDOWN DETECTION CIRCUIT AND METHOD THEREFOR

(75) Inventor: Darrell Hill, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/608,602

(22) Filed: Jun. 27, 2003

(51) Int. Cl.[7] .......................... H03F 3/04; H03F 1/52
(52) U.S. Cl. .......................... 330/298; 330/207 P
(58) Field of Search .......................... 330/298, 207 P

(56) References Cited

U.S. PATENT DOCUMENTS

| | | | |
|---|---|---|---|
| 3,895,297 A | * | 7/1975 | Jarl .......................... 324/765 |
| 5,068,703 A | * | 11/1991 | Conzelmann et al. ....... 257/536 |
| 6,043,969 A | * | 3/2000 | Sharpe-Geisler ........... 361/111 |
| 6,137,366 A |   | 10/2000 | King |
| 6,225,867 B1 | * | 5/2001 | Ilowski et al. .............. 330/298 |
| 6,661,290 B2 | * | 12/2003 | Sugiura ....................... 330/289 |

FOREIGN PATENT DOCUMENTS

WO    WO 99/52192    10/1999

* cited by examiner

Primary Examiner—Patricia Nguyen
(74) Attorney, Agent, or Firm—Ingrassia, Fisher & Lorenz

(57) ABSTRACT

An apparatus for detecting the onset of avalanche breakdown in a radio frequency bipolar power transistor is provided. The radio frequency bipolar power transistor includes a first transistor cell and a second transistor cells. The first and second transistor cells are functioning cells of the radio frequency bipolar transistor. The first transistor has a base ballast resistor. The second transistor cell has an emitter ballast resistor. The operation of the first and second transistor cells are monitored and compared against one another. A first difference voltage is generated from the first and second transistor cells under normal operating conditions. A second difference voltage is generated from the first and second transistor cells at the onset of avalanche breakdown.

20 Claims, 3 Drawing Sheets

RADIO FREQUENCY POWER TRANSISTOR AVALANCHE BREAKDOWN DETECTION CIRCUIT AND METHOD THEREFOR

FIELD OF THE INVENTION

The present invention generally relates to radio frequency power transistors, and more particularly relates to the detection of the onset of avalanche breakdown in a radio frequency power transistor to prevent damage of the device.

BACKGROUND OF THE INVENTION

Wireless devices such as cellular phones, personal digital assistants (PDAs), laptop computers, and wireless controllers are being embraced by the consumer because they eliminate the need for wired connections. Moreover, wireless interconnectivity can be achieved with little degradation when compared to wired networks. Each wireless device transmits or receives data. The frequency at which these devices operate typically exceed 500 megahertz with many operating in a frequency range of 1.5 gigahertz to 5 gigahertz.

A radio frequency (RF) amplifier is incorporated in a wireless device to transmit the information. In general, the radio frequency amplifier is connected to an antenna to disperse the signal in a directional or non-directional pattern depending on the application. The power output of the radio frequency amplifier can vary greatly. Hand held devices such as cellular phone may require less than a quarter watt output to transmit to the nearest cellular receiver. Conversely, a television station may require amplifiers having kilowatts of power.

The power transistor(s) used in a RF amplifier typically operate in a gain configuration where the device is non-saturated. In general, the load on the RF amplifier is an antenna. The impedance of the load is matched to the impedance of the RF amplifier to efficiently transmit power. Voltage standing wave ratio (VSWR) is a measure of how close the load impedance and amplifier impedance match. Failure to match impedances will produce standing waves that result in signal reflection at the load. Ideally, the impedance of the load stays fixed. In practical applications this is far from the truth. For example, a cellular phone has a RF amplifier and an antenna that under normal operating conditions can be placed in a limitless number of environments. The impedance of a load such as an antenna will vary with motion and position thereby creating a condition where a load mismatch occurs. In some cases, a large voltage transient is produced that can damage the power transistor, in part, because the loading is inductive. Catastrophic damage is possible when the output voltage exceeds the breakdown voltage of the RF power transistor producing a situation (avalanche breakdown) where the safe operating area of the device is exceeded.

One prior art methodology uses passive components to protect the RF amplifier by limiting the voltage that is coupled back to the amplifier. Passive components such as resistors, capacitors, and inductors are used to form the protective circuit. Although they can be used successfully to reduce the threat of damage, the passive components also introduce undesirable effects on amplifier performance. For example, power gain, amplifier efficiency, amplifier linearity, and manufacturing cost are all parameters that suffer when adding these discrete components to enhance amplifier protection.

Thus, it should be appreciated that it would be desirable to provide a RF power transistor that could operate close to the limits of voltage breakdown to increase the efficiency of operation. In addition, it is desirable for the RF power transistor to provide a signal indicated the onset of avalanche breakdown to prevent this damaging condition from occurring. Furthermore, other desirable features and characteristics of the present invention will become apparent from the subsequent detailed description and the appended claims, taken in conjunction with the accompanying drawings and the foregoing technical field and background.

BRIEF SUMMARY OF THE INVENTION

A radio frequency power transistor is provided. The radio frequency power transistor has a collector, a base, an emitter, a first output, and a second output. The radio frequency power transistor comprises a first transistor cell having a base ballast resistor and a second transistor cell having an emitter ballast resistor. The operating differences of the first and second transistors cells are monitored. The first and second transistor cells generate a first difference voltage when the radio frequency power transistor is operating at voltages below where avalanche breakdown occurs. The first and second transistor cells generate a second difference voltage at the onset of avalanche breakdown.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

A radio frequency (RF) power transistor in a wireless application is susceptible to being placed in a situation that could produce voltage swings that are potentially catastrophic to the device thereby rendering the product unusable. For example, radio frequency (RF) power transistors are used in power amplifiers for transmitting information from the wireless device. In general, the radio frequency power transistor is coupled to an antenna. One aspect of a wireless product is mobility which in some applications can mean constant movement of the device. The impedance of the load on the radio frequency power transistor varies with motion and position greatly affecting the operating characteristics of the RF amplifier. Most wireless devices are designed with these environmental unknowns in mind which yields extremely conservative designs to reduce opportunities for failure.

Figure 1:
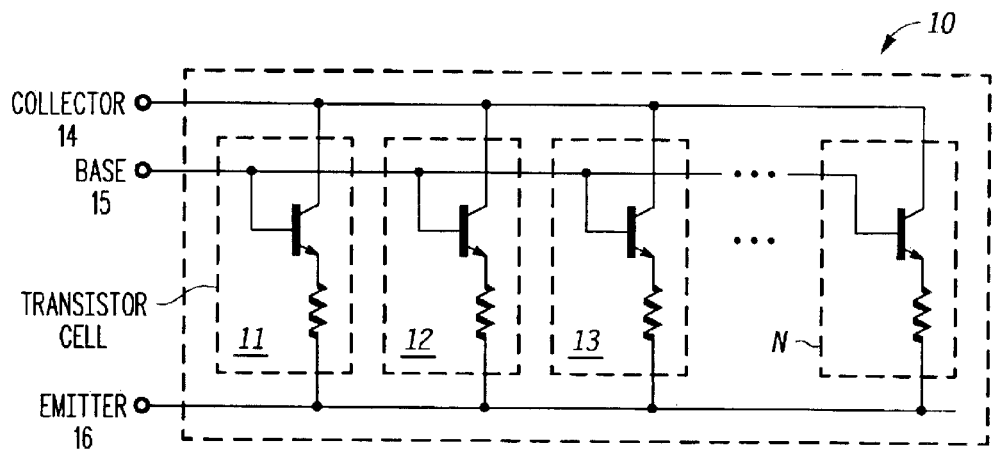
FIG. 1 is an illustration of a prior art radio frequency bipolar transistor.

FIG. 1 is an illustration of a prior art radio frequency (RF) bipolar power transistor 10. RF bipolar power transistor 10 has a collector 14, a base 15, and an emitter 16. RF bipolar power transistor 10 is not specific to any type of semiconductor material and can be formed from many material types. For example, silicon, germanium, silicon-germanium, and GaAs are but a few of the materials representative of RF bipolar power transistor 10. RF bipolar power transistor 10 is a current gain device. Typically, RF bipolar power transistor 10 is used in a common emitter configuration in a radio frequency power amplifier that under normal operating conditions follows these well known equations current gain equations for bipolar transistors.

(Equation 1) $I_c = \beta * I_b$ where $I_c$ is the collector current of the bipolar transistor, $I_b$ is the base current of the bipolar transistor, and $\beta$ is the current gain of the bipolar transistor.

(Equation 2) $I_e = (\beta+1) * I_b$ where $I_e$ is the emitter current of the bipolar transistor.

Power transistors are typically not manufactured as a single device but comprise a number of transistor cells coupled in parallel. RF bipolar power transistor 10 comprises N transistor cells where N is selected based on the operating characteristics required for the device. In an embodiment of RF bipolar power transistor 10, transistor cells 11, 12, 13, and up to N transistor cells are coupled in parallel to one another. As shown, transistor cell 11, 12, 13, and N each comprises a transistor and an emitter ballast resistor. The emitter ballast resistor is used to degenerate the transistor of each transistor cell to prevent variations in transistor structure or operating conditions (ex. temperature) from creating a situation where some transistor cells carry significantly more current than the other transistor cells. Ideally, each transistor cell carries a substantially equal current and operates under substantially equal conditions.

Figure 2:
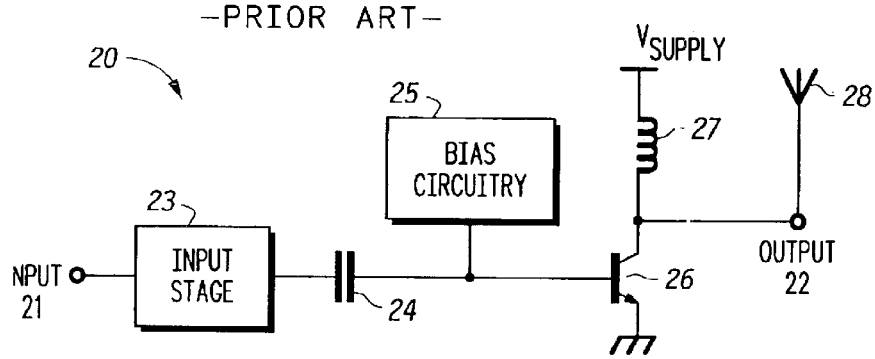
FIG. 2 is a block diagram of a prior art radio frequency amplifier.

FIG. 2 is a block diagram of a prior art radio frequency (RF) amplifier 20. RF amplifier 20 has two stages of gain. RF amplifier 20 has an input 21 and an output 22. RF amplifier 20 drives an antenna 28. RF amplifier 20 comprises an input stage 23, a capacitor 24, bias circuitry 25, a radio frequency (RF) power transistor 26, and an inductor 27.

Input stage 23 has an input coupled to input 21 and an output. A capacitor 24 ac couples a signal at the output of input stage 23 to RF power transistor 26. Capacitor 24 has a first terminal coupled to the output of input stage 23 and a second terminal. RF power transistor 26 has a collector coupled to output 22, a base coupled to the second terminal of capacitor 24, and an emitter coupled to ground. Bias circuitry 25 has an output coupled to the base of RF power transistor 26. Bias circuitry 25 biases RF power transistor 26 to receive and amplify RF signals from input stage 23. How RF power transistor 26 is biased is a function of the mode of operation of RF amplifier 20 and is a significant factor on power dissipation as is well known by one skilled in the art. Inductor 27 has a first terminal coupled for receiving a power supply voltage Vsupply and a second terminal coupled to the collector of RF power transistor 26.

A radio frequency signal applied to input 21 is amplified by input stage 23. Capacitor 24 couples the amplified RF signal to the base of RF power transistor 26. RF power transistor 26 further amplifies the signal and drives the load on output 22 corresponding to antenna 28. It should be noted that inductor 27 is a short circuit coupling the collector of RF power transistor 26 to the power supply voltage Vsupply under DC conditions. Conversely, inductor 27 appears as an open circuit to the radio frequency signals being amplified.

Impedance matching is an important design aspect of RF amplifier 20 to efficiently transfer power to antenna 28. Ideally, the impedance looking into output 22 of RF amplifier 20 matches the impedance of antenna 28. Typically, a passive network (not shown) is coupled to output 22 to match the impedance of RF amplifier 20 to the impedance of antenna 28. As mentioned hereinabove, the impedance and external conditions provided at output 22 can vary widely. Severe impedance mismatches may occur at output 22 that produce voltage transients on the collector of RF power transistor 26 that can induce catastrophic voltage breakdown. The stored energy in inductor 27 can play a role in producing the voltage transients on the collector of RF power transistor 26.

RF amplifier 20 is designed to prevent a fatal damaging event from occurring. Passive components (not shown) forming a protective network are often used to protect RF amplifier 20 from a voltage transient at output 22 but are typically detrimental to the performance of RF amplifier 20. Another approach detects the base-emitter voltage across RF power transistor 26 and absorbs the signal coupled to the base of RF power transistor 26 when a predetermined threshold base-emitter voltage is exceeded. As will be shown hereinbelow, voltage breakdown of RF power transistor 26 varies depending on the specific operating condition of RF amplifier 20 and cannot be optimized by defining a single operating point where voltage protection is enabled.

In general, RF amplifier 20 is designed for survival under worst-case conditions which represents less than 0.1% of the operating time. For example, a cellular handset operates at 2.8 to 3.5 volts and uses InGaP bipolar transistors in the radio frequency power amplifier. The breakdown voltage specified for this application is typically between 20–30 volts. The reason for such a high device breakdown voltage is to cover a worst case scenario such as the phone being operated off of a battery charger, the battery is removed, and the antenna is simultaneously placed against a metallic frame. What this means is that the device design criteria is a performance tradeoff. Breakdown voltage and device frequency response are somewhat inversely related. In other words, a transistor designed for high breakdown voltage will have reduced frequency performance which may limit their use for certain applications.

Figure 3:
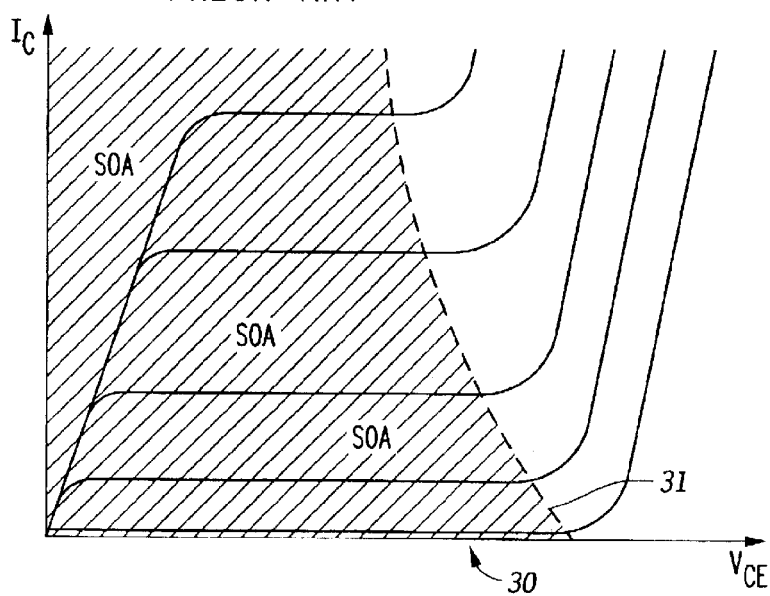
FIG. 3 is an illustration of a prior art family of operating curves for a radio frequency bipolar transistor.

FIG. 3 is an illustration of a prior art family of operating curves for a radio frequency (RF) bipolar transistor. The RF bipolar transistor is operating in a common emitter configuration similar to that shown in FIG. 2. Each curve shows the collector current $I_c$ versus collector to emitter voltage $V_{ce}$ of the radio frequency bipolar transistor. A curve 31 delineates a point in each curve where the RF bipolar transistor is at the onset of impact ionization multiplication which initiates avalanche breakdown.

The RF bipolar transistor is operated below curve 31 when used in a RF amplifier. The area below curve 31 is known as the safe operating area (SOA) for the device. Besides safe operation, the RF bipolar transistor can be successfully used in a gain configuration with high linearity over a wide range of signal levels. In general, the RF bipolar transistor operated in a region below curve 31 where the device is not in saturation (both collector-base and base-emitter junctions forward biased) substantially follows the current gain equation $I_{b*}(\beta+1)=I_e$. A RF amplifier designed for worst case conditions to prevent catastrophic damage would only operate the RF bipolar transistor near curve 31 under several conditions that would almost never occur and would comprise a small fraction of its operating life. Under normal operating conditions (and the majority of the time) the RF power transistor would be operating well below curve 31.

Above curve 31, the $I_c$ vs $V_{ce}$ curves of the RF bipolar transistor see a rapid increase in collector current as avalanche breakdown occurs. In a common emitter configuration this is also known as secondary breakdown of the RF bipolar transistor. The RF bipolar transistor cannot operate for any length of time above curve 31 without being damaged. It should be noted that the point at which breakdown begins to occur varies depending on the operating conditions of the RF bipolar transistor. For example, the onset of secondary breakdown occurs at a relatively high $V_{ce}$ when the collector current is of a low magnitude. Conversely, secondary breakdown occurs at a much lower $V_{ce}$ when the RF bipolar transistor is operated at higher collector currents. In either case, the current abruptly increases in the region above curve 31 greatly increasing the power dissipated by the device which leads to catastrophic damage.

One option in designing a RF power amplifier is to select a RF power transistor having operating characteristics such as avalanche breakdown voltage that exceeds all operating conditions that will arise within the RF power amplifier. A second option is to actively prevent the RF power transistor from operating in the region above curve 31. This is commonly achieved by detecting a single data point such as specific current or voltage condition and then reducing the input signal applied to the RF power amplifier when the (voltage or current) threshold is exceeded thereby lowering the output signal swing before damage occurs to the RF power transistor. Operating in this fashion is far from the ideal. Using a RF power transistor that meets the specific requirements of the application (without being severely over designed) would be possible if the onset of avalanche breakdown could be detected for any operating condition and adjustments made to prevent operation above curve 31.

Figure 4:
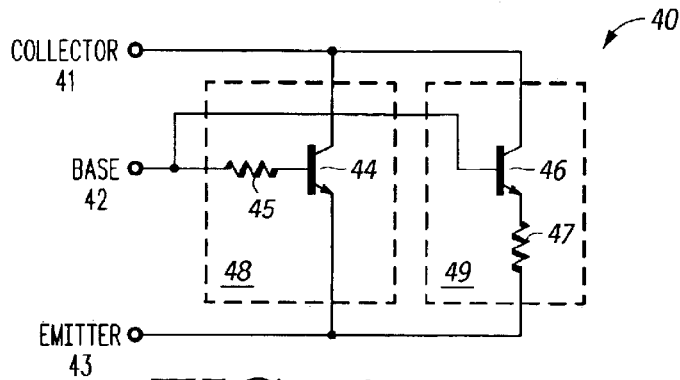
FIG. 4 is an illustration of two transistor cells in a radio frequency bipolar transistor for indicating the onset of avalanche breakdown in accordance with the present invention.

FIG. 4 is an illustration of two transistor cells in a radio frequency (RF) bipolar power transistor 40 for indicating the onset of avalanche breakdown in accordance with the present invention. RF bipolar power transistor 40 comprises a transistor cell 48 and a transistor cell 49. In general, RF bipolar transistor 40 is formed from many transistor cells (not shown) of which transistor cells 48 and 49 are used to sense the operating condition. RF bipolar power transistor 40 has a collector 41, a base 42, and an emitter 43.

Transistor cell 48 comprises a transistor 44 and a resistor 45. Resistor 45 has a first terminal coupled to the base of RF bipolar power transistor 40 and a second terminal. Transistor 48 has a collector coupled to collector 41 of RF bipolar power transistor 40, a base coupled to the second terminal of resistor 45, and an emitter coupled to emitter 43 of RF bipolar power transistor 40. Resistor 45 is a ballast resistor.

Transistor cell 49 comprises a transistor 46 and a resistor 47. Transistor 49 has a collector coupled to collector 41 of RF bipolar power transistor 40, a base coupled to base 42 of RF bipolar power transistor 40, and an emitter. Resistor 47 has a first terminal coupled to the emitter of transistor 46 and a second terminal coupled to emitter 43 of RF bipolar power transistor 40. Resistor 47 is a ballast resistor.

In an embodiment of RF bipolar transistor 40, transistor cells 48 and 49 operate substantially equal under normal operating conditions. Normal operating conditions are when RF bipolar transistor 40 is operating within the safe operating area (SOA) of the device. Furthermore, transistors cells 48 and 49 substantially operate under the $I_{b*}(\beta+1)=I_e$ characteristic when used as an output gain stage in a RF amplifier. In an embodiment of RF bipolar transistor 40, each transistor in each transistor cell, including transistor cells 48 and 49 are identical in size. This ensures that all transistors operate identically in RF bipolar transistor 40. Similarly, the emitter ballast resistor of each transistor in each transistor cell would have an equal resistance value as resistor 47 of transistor cell 49. To make transistor cells 48 and 49 operate substantially equal under normal operating conditions, resistor 45 is made to have a resistance value ($\beta$+1) times the resistance of resistor 47 where $\beta$ is the current gain of transistors 44 and 46.

A difference that is produced in transistor cells 48 and 49 is exploited as the onset of avalanche breakdown occurs to produce a detection methodology under any operating condition of RF bipolar power transistor 40. Avalanche voltage breakdown is due to impact ionization multiplication. Carriers in the RF bipolar transistor 40 can excite electron-hole pairs when the electric field exceeds a certain value (corresponding to $V_{ce}$) by impact ionization. For example, the onset of impact ionization multiplication (avalanche breakdown) results in additional current being provided to the base of transistors 44 and 46. The additional current is due in part to impact ionization occurring in the collector-base junction of transistors 44 and 46. The additional base current increases the collector/emitter current of transistors 44 and 46. Unchecked, the additional base current is a positive feedback mechanism that increases collector current which in turn increases the base current until the device is destroyed. This is evidenced by the rapid increase in current shown in FIG. 3 for each curve above the safe operating area.

The operating characteristics of RF bipolar power transistor 40 deviate from the $I_{b*}(\beta+1)=I_e$ characteristics at the onset of avalanche breakdown. It appears that the transistor current gain is increasing because impact ionization multiplication is providing additional base current from the collector-base junctions of transistors 44 and 45. In the limit, as avalanche breakdown in RF bipolar power transistor 40 occurs a substantial impact ionization current is provided at the base of transistors 44 and 46. Viewed from transistor cell 49, the base current of transistor 46 is reduced at the onset of impact ionization multiplication as the impact ionization current corresponds to a negative base current. The same scenario occurs in transistor cell 48, the difference being resistor 45 in the path of the base current of transistor 44. The voltage across resistor 45 is reduced due to the impact ionization current. It is this difference in the operation of transistor cells 48 and 49 that will be used to detect the onset of avalanche breakdown to prevent it from advancing to a destructive stage.

Figure 5:
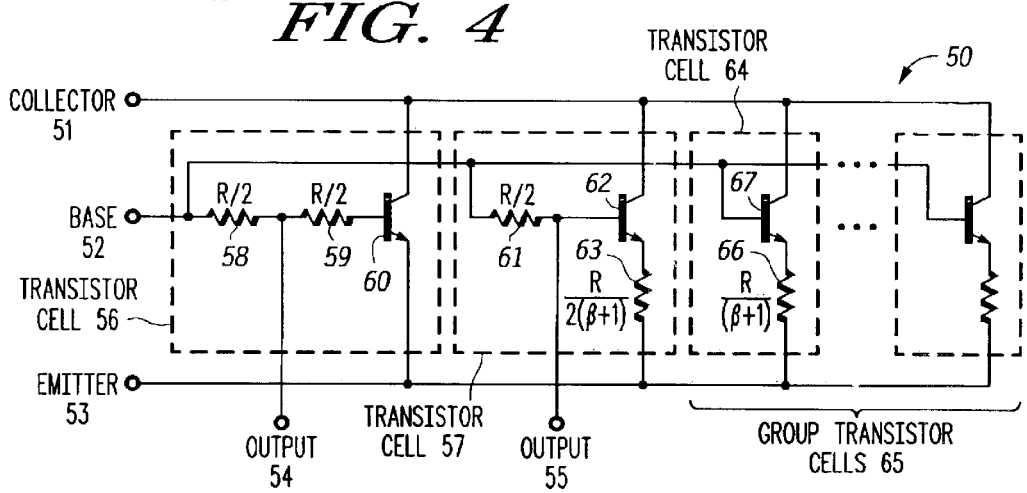
FIG. 5 is a schematic diagram of a radio frequency bipolar power transistor in accordance with the present invention.

FIG. 5 is a schematic diagram of a radio frequency (RF) bipolar power transistor 50 in accordance with the present invention. RF bipolar power transistor 50 comprises more than one transistor cell coupled in parallel to one another and is not limited to any specific type of bipolar transistor. RF bipolar power transistor 50 has a collector 51, a base 52, an emitter 53, an output 54, and an output 55. RF bipolar power transistor 50 outputs a first difference voltage across outputs 54 and 55 when RF bipolar power transistor is not in avalanche breakdown and operating in the safe operating are of the device. RF bipolar transistor 50 outputs a second difference voltage as impact ionization multiplication occurs due to avalanche breakdown. Moreover, the detection of avalanche breakdown is independent of the operating conditions of the device and is detectable before the conduction of large damaging currents. This allows time to suppress the voltage transition inducing avalanche breakdown before RF bipolar power transistor 50 is permanently damaged such that the device can be operated to its fullest limits without fear of damage due to voltage breakdown. From an amplifier design perspective, power transistors can designed for best nominal performance rather than for survival under worst case operating conditions allowing lower cost and higher performance devices to be used.

RF bipolar power transistor 50 comprises a transistor cell 56 and a transistor cell 57. Transistor cell 56 comprises a resistor 58, a resistor 59, and a transistor 60. Resistors 58 and 59 are ballast resistors for transistor cell 56. Resistor 58 has a first terminal coupled to base 52 and a second terminal coupled to output 54. Resistor 59 has a first terminal coupled to output 54 and a second terminal. Transistor 60 has a collector coupled to collector 51, a base coupled to the second terminal of resistor 59 and an emitter coupled to emitter 53.

Transistor cell 57 comprises a resistor 61, a transistor 62, and a resistor 63. Resistors 61 and 63 are ballast resistors for transistor cell 57. Resistor 61 has a first terminal coupled to base 52 and a second terminal coupled to output 55. Transistor 62 has a collector coupled to collector 51, a base coupled to output 55, and an emitter. Resistor 63 has first terminal coupled to the emitter of transistor 62 and a second terminal coupled to emitter 52.

Transistor cells 56 and 57 operate substantially equal to one another under normal operating conditions. A condition when RF power transistor 50 is approaching avalanche breakdown and could be damaged would not be considered normal operating conditions. In an embodiment of RF bipolar power transistor 50, transistors 60 and 62 have equal geometries. Under normal operating conditions, transistors 60 and 62 have a current gain $I_e = I_b * (\beta + 1)$ where $I_e$ is the emitter current, $I_b$ is the base current, and $\beta$ is the current gain of transistors 60 and 62.

Transistor cells 56 and 57 will operate substantially equal to one another if resistors 58, 59, 61, and 63 have values that are related to the current gain equation listed hereinabove. In an embodiment of RF bipolar power transistor 50, a resistance value of R is selected from which each resistor value will be derived. The actual value of R is chosen based on what type of resistive material is available on the wafer process, the difference voltage value needed to detect the onset of avalanche breakdown, and the ability to match/ratio resistance values. It should be noted that the values selected are for illustrative purposes. It may be desirable to change the resistor values to alter the difference voltages produced for normal operation and when avalanche breakdown occurs depending on how RF bipolar power transistor 50 is used. In an embodiment of RF bipolar power transistor 50, resistors 58, 59, and 61 have a resistance value of R/2. Note that the combined resistance of resistors 58 and 59 is a resistance value R that ballasts transistor cell 56. The value of resistance for resistor 63 has to be adjusted to account for the fact that resistors 58, 59, and 61 conduct base current and resistor 63 conducts emitter current if they are to be operated substantial equal. Resistor 63 has a resistance value of $R/2(\beta+1)$ to maintain transistor cells 56 and 57 operating equally.

Other resistance values can also be selected under the condition that transistor cells 56 and 57 operate substantially equal under normal operating conditions. Resistors 58 and 59 combine to have a resistance R. Resistors 58 and 61 are selected to have equal resistance. For example, resistors 58 and 61 are selected to have a resistance value of R/3. Resistor 59 then has a resistance value of 2R/3 and resistor 62 has a resistance value of $2R/3(\beta+1)$ such that transistor cells 56 and 57 operate substantially equal.

Under normal operating conditions, a voltage measured from output 54 to emitter 53 would equal a voltage measured from output 55 to emitter 53 (transistors 60 and 62 have substantially equal collector, base, and emitter currents). A difference voltage is created across outputs 54 and 55 at the onset of impact ionization multiplication because of the split between transistor cells 56 and 57 respectively having ballasting in the base and emitter. The difference voltage is created because impact ionization multiplication creates a current through the collector-base junction of transistors 60 and 62 that changes the current gain characteristics of transistors 60 and 62. Positive feedback occurs because the impact ionization current is fed to the base of transistors 60 and 62 where it is multiplied by the current gain of the device. The impact ionization multiplication current flows in an opposite direction as the base current and reduces the voltage across resistor 59. In part, this is some of the difference that is detected between transistor cells 56 and 57 at the onset of avalanche breakdown. Thus, a voltage drop across resistor 59 and the base-emitter junction voltage of transistor 60 will differ from a voltage drop across resistor 63 and the base-emitter junction voltage of transistor 62 creating a difference voltage across outputs 54 and 55 indicating the onset of avalanche breakdown.

In one embodiment, RF bipolar power transistor 50 further comprises a group of transistor cells 65. Group of transistor cells 65 distribute the current and power requirements of RF bipolar power transistor 50 through a large number of transistor cells besides transistor cells 56 and 57. In general, a transistor cell 64 is indicative of a transistor cell of group of transistor cells 65. Transistor cell 64 comprises a transistor 67 and a resistor 66. Transistor 67 has a collector coupled to collector 51, a base coupled to base 52, and an emitter. Resistor 66 has a first terminal coupled to the emitter of transistor 67 and a second terminal coupled to emitter 53.

Transistor cell 64 utilizes emitter resistor ballasting. Resistor emitter ballasting is typically chosen because it requires a small resistance value which usually takes up the smallest amount of area on the die. In an embodiment of RF bipolar power transistor 50, each transistor cell of group of transistor cells 65 is designed to operate substantially equal to transistor cells 56 and 57. Transistor 67 has equal geometry as transistors 60 and 62. Resistor 66 has a resistance value of $R/(\beta+1)$ thereby making transistor cell 64 substantially equal under normal operating conditions as transistor cells 56 and 57.

Figure 6:
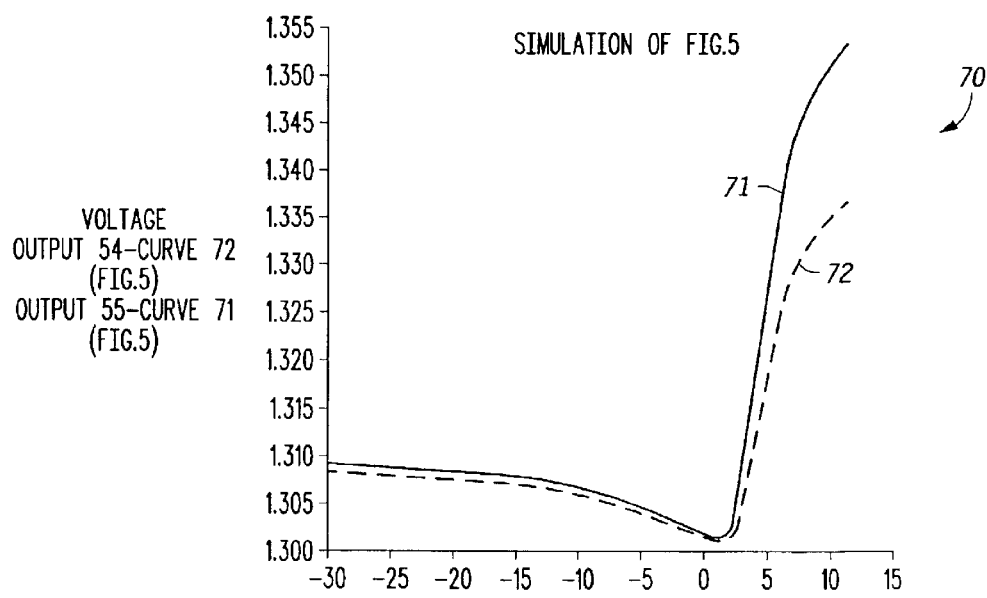
FIG. 6 is a graph representative of the voltages produced at output 54 and output 55 of the radio frequency bipolar power transistor of FIG. 5.

FIG. 6 is a graph 70 representative of the voltages produced at output 54 and output 55 of the radio frequency bipolar power transistor of FIG. 5. The graph is a simulation of a radio frequency bipolar power transistor having transistors cells configured similar to transistor cell 56 and transistor cell 57 of FIG. 5 and is useful to show operation of the detection circuitry. The curve 71 corresponds to output 55 of RF bipolar power transistor 50 of FIG. 5. The curve 72 corresponds to output 54 of RF bipolar power transistor 50 of FIG. 5. The X-axis is the input RF power to the transistor cells.

Under normal operating conditions, curves 71 and 72 have substantially equal voltages. Ideally, curves 71 and 72 will overlap each other corresponding to zero difference voltage being created. In practice, the transistor cells cannot be matched perfectly but should track each other with an approximately constant offset between curves 71 and 72 in the region of normal operation. The onset of avalanche breakdown produces impact ionization multiplication creating a current from the collector to base of each transistor cell. Curves 71 and 72 fall to a minimum voltage as the impact ionization current produces the net effect of reducing the base current being provided externally to each transistor cell.

As mentioned previously, avalanche breakdown is a positive feedback phenomenon where the impact ionization current increases as breakdown progresses. The simulation created this condition by increasing the input power to the transistor cells. The impact ionization current, in part, provides base current that further increases the collector and emitter current of the device. Curve 72 does not rise as fast as curve 71 as the simulated avalanche breakdown progresses. Curve 72 represents the transistor cell having the base ballast resistor (corresponding to resistor 59 of FIG. 5). The impact ionization current produces a voltage drop across the base ballast resistor that reduces the voltage of curve 72 when compared with curve 71 (corresponding to transistor cell 57 of FIG. 5 that does not have a base ballast resistor similar to resistor 59). As can be readily seen curves 71 and 72 diverge from one another corresponding to the onset of avalanche breakdown. The difference between curves 71 and 72 corresponds to the difference voltage produced across outputs 54 and 55 of FIG. 5. Thus, this difference voltage is useful in identifying the early stages of avalanche breakdown.

Figure 7:
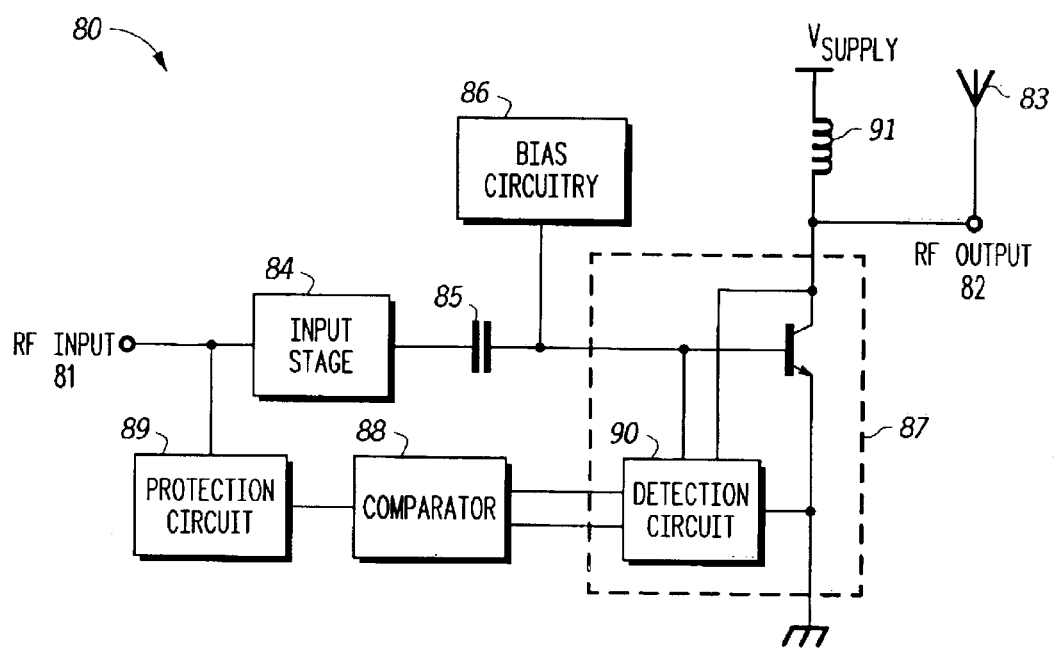
FIG. 7 is a block diagram of a radio frequency amplifier in accordance with the present invention.

FIG. 7 is a block diagram of a radio frequency (RF) amplifier 80 in accordance with the present invention. Radio frequency amplifier 80 has a RF input 81 and a RF output 82. An antenna 83 is coupled to RF output 82 to transmit a RF signal. RF amplifier 80 comprises an input stage 84, a capacitor 85, bias circuitry 86, a RF bipolar power transistor 87, a comparator 88, a protection circuit 89, and an inductor 91. RF amplifier 80 has two stages of gain.

Input stage 84 is a first gain stage for amplifying a RF signal applied to RF input 81. Input stage 84 has an input coupled to RF input 81 and an output. Capacitor 85 ac couples an amplified RF signal from input stage 84 to RF bipolar power transistor 87. Capacitor 85 has a first terminal coupled to the output of input stage 84 and a second terminal. RF bipolar power transistor 87 is a second gain stage of RF amplifier 80. RF bipolar power transistor 87 has a collector coupled to RF output 82, a base coupled to the second terminal of capacitor 85, and an emitter coupled to ground. RF bipolar power transistor is in a common emitter configuration. Bias circuitry 86 has an output coupled to the base of RF bipolar power transistor 87. Inductor 91 has a first terminal coupled for receiving a power supply voltage Vsupply and a second terminal coupled to RF output 82.

Bias circuitry 86 biases RF bipolar power transistor 87 for amplifying a RF signal. Inductor 91 is a low impedance at dc and low frequencies thereby coupling the collector or RF bipolar power transistor 87 to power supply voltage Vsupply to enable biasing. Inductor 91 appears as an open or high resistance at the radio frequencies being amplified by RF amplifier 80. The loading on RF output 82 is antenna 83. Ideally, for maximum efficiency, the impedance looking into RF output 82 is matched to the load impedance of antenna 83.

RF bipolar power transistor 87 further includes a detection circuit 90 having a first input coupled to the collector of RF bipolar power transistor 87, a second input coupled to the base of RF bipolar power transistor 87, and a third input coupled to the emitter of RF bipolar transistor 87, a first output and a second output. In a first mode, detection circuit 90 generates a first difference voltage corresponding to a state where RF amplifier 80 is operating under normal conditions within the safe operating area of RF bipolar power transistor 87. Comparator 88 outputs a signal that disables protection circuit 89 from affecting a signal applied to RF input 81 or input stage 84. In a second mode, detection circuit 90 generates a second difference voltage corresponding to a state where a significant impact ionization current is being generated in RF bipolar power transistor 87. The second mode prevents damage to RF bipolar power transistor 87. Comparator 88 receives the second difference voltage and outputs a signal enabling protection circuit 89. In an embodiment of RF amplifier 80, protection circuit 89 creates an impedance mismatch at RF input 81 that reflects a RF signal applied thereto thereby reducing the signal level at the input of input stage 84. The reduction in signal level at RF input 81 decreases the signal applied to the base of RF bipolar power transistor 87 to reduce the signal swing at RF output 82 and prevent catastrophic avalanche breakdown. It should be noted that the signal level reduction does not have to occur at RF input 81 but could be applied with good results anywhere in the path or directly to the base of RF bipolar power transistor 87.

In practice, detection circuit 90 will be subject to both transistor and resistor mismatches due to standard variations in wafer processing. Similarly, the point at which comparator 88 switches is a function of the input voltage offset and gain. Techniques such as resistor trimming or offset correction can be used to reduce the effects of process variations to ensure protection circuit 89 engages at the appropriate time to prevent damage. It may also be beneficial to use these techniques to center the switching point of comparator 88 between the difference voltage produced in the first mode and a difference voltage produced in the second mode.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A radio frequency power transistor having a collector, a base, an emitter, a first output, and a second output, the radio frequency power transistor comprising:

a first transistor having a first electrode coupled to the collector of the radio frequency power transistor, a control electrode coupled to the first output of the radio frequency transistor, and a second electrode;

a first resistor having a first electrode coupled to the base of the radio frequency power transistor and a second electrode coupled to the first output of the radio frequency transistor;

a second resistor having a first electrode coupled to said second electrode of said first transistor and a second electrode coupled to the emitter of the radio frequency power transistor;

a second transistor having a first electrode coupled to the collector of the radio frequency power transistor, a control electrode, and a second electrode coupled to the emitter of the radio frequency power transistor;

a third resistor having a first electrode coupled to the base of the radio frequency power transistor and a second electrode coupled to the second output of the radio frequency power transistor; and a fourth resistor having a first electrode coupled to the second output of the radio frequency power transistor and a second electrode coupled to said control electrode of said second transistor.

2. The radio frequency power transistor of claim 1 further including:

a plurality of transistors wherein each transistor of said plurality of transistors has a first electrode coupled to the collector of the radio frequency power transistor, a control electrode coupled to the base of the radio frequency power transistor, and a second electrode; and a plurality of resistors wherein each resistor corresponds to a transistor of said plurality of transistors and wherein each resistor has a first electrode coupled to said second electrode of said corresponding transistor of said plurality of transistors and a second electrode coupled to the emitter of the radio frequency power transistor.

3. The radio frequency power transistor of claim 2 wherein said first transistor, said second transistor, and said plurality transistors are substantially equal.

4. The radio frequency power transistor of claim 3 wherein the radio frequency power transistor operates where an emitter current $I_e$ is substantially equal to $(\beta+1)*I_b$ where $\beta$ is a transistor current gain and $I_b$ is a base current before an onset of avalanche breakdown.

5. The radio frequency power transistor of claim 4 wherein each resistor of said plurality of resistors has a resistance $R/(\beta+1)$.

6. The radio frequency power transistor of claim 5 wherein said first resistor has a resistance value equal to said fourth resistor.

7. The radio frequency power transistor of claim 6 wherein said third resistor and said fourth resistor combine to have a resistance equal to R.

8. The radio frequency power transistor of claim 7 wherein a first difference voltage is produced across the first and second outputs of the radio frequency power transistor under normal operating conditions when the radio frequency power transistor is not producing a substantial impact ionization current.

9. The radio frequency power transistor of claim 8 wherein a second difference voltage is produced across the first and second outputs of the radio frequency power transistor when an impact ionization current is produced at an onset of avalanche breakdown and wherein said first and second difference voltages are not equal.

10. A method for detecting an onset of avalanche breakdown in a radio frequency power transistor, the radio frequency power transistor comprising a plurality of transistor cells coupled in parallel, the method comprising the steps of:

operating the radio frequency power transistor in a range where an emitter current $I_e$ of the radio frequency power transistor is substantially equal to $(\beta+1)I_b$ where $I_b$ is a base current and $\beta$ is the current gain of the radio frequency power transistor; and detecting the onset of avalanche breakdown when the radio frequency power transistor no longer operates under a relationship where $I_e$ is substantially equal to $(\beta+1)I_b$ due to impact ionization multiplication.

11. The method as recited in claim 10 wherein said step of operating the radio frequency power transistor further includes a step of operating each transistor cell of said plurality of transistor cells substantially equal.

12. The method as recited in claim 10 wherein said step of detecting the onset of avalanche breakdown further includes a step of monitoring an increase in impact ionization current as the radio frequency power transistor approaches the onset of avalanche breakdown.

13. The method as recited in claim 10 wherein said step of detecting the onset of avalanche breakdown further includes the steps of:

providing a first transistor cell of said plurality of transistor cells having an emitter ballast resistor;

providing a second transistor cell of said plurality of transistor cells having a base ballast resistor wherein said first and second transistor cells; and comparing operation of said first and second transistor cells.

14. A radio frequency (RF) power amplifier having an input and an output comprising:

an inductor having a first terminal coupled for receiving a first power supply voltage and a second terminal coupled to the output of the RF power amplifier; and a radio frequency power transistor having a collector coupled to the output of RF power amplifier, a base, an emitter coupled for receiving a second power supply voltage, a first output, and a second output wherein a first difference voltage is generated across said first and second outputs when said radio frequency power transistor is not subject to avalanche breakdown and wherein a second difference voltage is generated across said first and second outputs at an onset of avalanche breakdown in said radio frequency power transistor.

15. The radio frequency (RF) power amplifier as recited in claim 14 further including:

an input stage having an input coupled to the input of the RF power amplifier and an output;

a capacitor having a first terminal coupled to the output of the input stage and a second terminal coupled to said base of said radio frequency power transistor;

a bias circuit coupled said base of said radio frequency power transistor;

a comparator having a first input coupled to said first output of said radio frequency power transistor, a second input coupled to said second output of said radio frequency power transistor, and an output; and a protection circuit having an input coupled to said output of said comparator and an output coupled to the input of the RF power amplifier.

16. The radio frequency (RF) power amplifier as recited in claim 15 wherein said protection circuit is disabled when said first difference voltage is generated across the first and second outputs of said radio frequency power transistor and wherein said protection circuit is enabled for reducing an input signal applied to the input of the RF power amplifier when said second difference voltage is generated across the first and second outputs of said radio frequency power transistor.

17. The radio frequency (RF) power amplifier as recited in claim 14 wherein said radio frequency power transistor comprises a plurality of transistor cells and includes a first transistor cell having a base ballast resistor and a second transistor cell having an emitter ballast resistor.

18. The radio frequency (RF) power amplifier as recited in claim 17 wherein said first transistor cell of said radio frequency power transistor comprises:
   a first resistor having a first terminal coupled to said base of said radio frequency power transistor and a second terminal coupled to said first output of said radio frequency power transistor;
   a second resistor having a first terminal coupled to said first output of said radio frequency power transistor and a second terminal; and
   a transistor having a collector coupled to said collector of said radio frequency power transistor, a base coupled to said second terminal of said second resistor, and an emitter coupled to said emitter of said radio frequency power transistor.

19. The radio frequency (RF) power amplifier as recited in claim 18 wherein said second transistor cell of said radio frequency power transistor comprises:
   a first resistor having a first terminal coupled to said base of said radio frequency power transistor and a second terminal coupled to said second output of said radio frequency power transistor;
   a transistor having a collector coupled to said collector of said radio frequency power transistor, a base coupled to said second output of said radio frequency power transistor, and an emitter; and
   a second resistor having a first terminal coupled to said emitter of said transistor of said second transistor cell and a second terminal coupled to said emitter of said radio frequency power transistor.

20. The radio frequency (RF) power amplifier as recited in claim 19 wherein said radio frequency power transistor further includes a plurality of transistor cells and wherein each transistor cell of said plurality of transistor cells comprises:
   a transistor having a collector coupled to said collector of said radio frequency power transistor, a base coupled to said base of said radio frequency power transistor, and an emitter; and
   a resistor having a first terminal coupled to said emitter of said transistor and a second terminal coupled to said emitter of said radio frequency power transistor.

\* \* \* \* \*